(12) United States Patent
Cha et al.

(10) Patent No.: US 10,753,977 B2
(45) Date of Patent: Aug. 25, 2020

(54) METHOD AND DEVICE FOR ESTIMATING DISCHARGE POWER OF SECONDARY BATTERY

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 622 days.

(21) Appl. No.: 15/308,320

(22) PCT Filed: Sep. 22, 2015

(86) PCT No.: PCT/KR2015/009952
§ 371 (c)(1),
(2) Date: Nov. 1, 2016

(87) PCT Pub. No.: WO2016/052900
PCT Pub. Date: Apr. 7, 2016

(65) Prior Publication Data
US 2017/0059662 A1 Mar. 2, 2017

(30) Foreign Application Priority Data
Oct. 1, 2014 (KR) .................. 10-2014-0132312

(51) Int. Cl.
*G01R 31/367* (2019.01)
*G01R 31/3842* (2019.01)
(Continued)

(52) U.S. Cl.
CPC ....... *G01R 31/367* (2019.01); *G01R 31/3647* (2019.01); *G01R 31/3842* (2019.01);
(Continued)

(58) Field of Classification Search
None
See application file for complete search history.

(56) References Cited

U.S. PATENT DOCUMENTS 5,635,842 A * 6/1997 Yokoo ............... G01R 31/3648
324/427
6,160,380 A * 12/2000 Tsuji .................. G01R 31/3648
320/132
(Continued)

FOREIGN PATENT DOCUMENTS

JP 2006-304516 A 11/2006
KR 10-2003-0013215 A 2/2003
(Continued)

OTHER PUBLICATIONS

Saha B., Goebel K., Modeling Li-ion Battery Capacity Depletion in a Particle Filtering Framework, Annual Conference of the Prognostics and Health Management Society (Year: 2009).*
(Continued)

*Primary Examiner* — Lina M Cordero
(74) *Attorney, Agent, or Firm* — Birch, Stewart, Kolasch & Birch, LLP

(57) ABSTRACT

The present disclosure relates to a method and an apparatus for estimating a discharge power of a secondary battery. The method according to the present disclosure includes setting a state of charge of a secondary battery for which estimation of discharge power is intended, discharging the secondary battery with a plurality of discharge currents while measuring a discharge termination voltage corresponding to each of the discharge currents, generating a current-voltage (I-V) profile that at least forms a point of intersection with the preset discharge boundary condition, and determining a discharge power using a current value and a voltage value corresponding to the point of intersection.

25 Claims, 7 Drawing Sheets

(51) Int. Cl.
*H01M 10/48* (2006.01)
*G01R 31/36* (2020.01)
*H01M 10/42* (2006.01)
*G01R 31/389* (2019.01)

(52) U.S. Cl.
CPC ....... *H01M 10/4285* (2013.01); *H01M 10/48* (2013.01); *G01R 31/389* (2019.01); *H01M 2010/4271* (2013.01)

(56) References Cited

U.S. PATENT DOCUMENTS

| | | | | |
|---|---|---|---|---|
| 6,661,231 | B1* | 12/2003 | Arai | G01R 31/3648 324/426 |
| 7,446,504 | B2 | 11/2008 | Plett | |
| 7,589,532 | B2 | 9/2009 | Plett | |
| 2003/0030442 | A1* | 2/2003 | Sugimoto | H02J 7/0021 324/429 |
| 2004/0024546 | A1* | 2/2004 | Richter | H01M 10/48 702/63 |
| 2005/0134282 | A1* | 6/2005 | Averbuch | G01R 31/367 324/426 |
| 2006/0087291 | A1* | 4/2006 | Yamauchi | H02J 7/0057 320/137 |
| 2006/0117194 | A1* | 6/2006 | Nishida | G01R 31/3842 713/300 |
| 2007/0145953 | A1* | 6/2007 | Asai | G01R 31/367 320/149 |
| 2008/0094034 | A1* | 4/2008 | Takahashi | H01M 10/44 320/134 |
| 2008/0103709 | A1* | 5/2008 | Yun | G01R 31/389 702/63 |
| 2008/0183347 | A1* | 7/2008 | Miki | B60L 15/2045 701/22 |
| 2009/0058366 | A1* | 3/2009 | Masuda | B60W 10/24 320/135 |
| 2009/0319108 | A1* | 12/2009 | Kawai | B60L 7/16 701/22 |
| 2010/0079111 | A1* | 4/2010 | Masuda | H01M 10/486 320/134 |
| 2012/0004875 | A1 | 1/2012 | Maeda et al. | |
| 2012/0143542 | A1* | 6/2012 | Wu | G01R 31/367 702/63 |
| 2013/0103333 | A1* | 4/2013 | Nishida | H01M 10/482 702/63 |
| 2015/0051854 | A1 | 2/2015 | Joe et al. | |
| 2015/0051855 | A1 | 2/2015 | Joe et al. | |
| 2015/0226809 | A1 | 8/2015 | Joe et al. | |

FOREIGN PATENT DOCUMENTS

| | | |
|---|---|---|
| KR | 10-2012-0002417 A | 1/2012 |
| KR | 10-2014-0070471 A | 6/2014 |
| KR | 10-2014-0071261 A | 6/2014 |
| KR | 10-2014-0071936 A | 6/2014 |

OTHER PUBLICATIONS

International Search Report for PCT/KR2015/009952 dated Jan. 6, 2016.

* cited by examiner

METHOD AND DEVICE FOR ESTIMATING DISCHARGE POWER OF SECONDARY BATTERY

TECHNICAL FIELD

The present disclosure relates to a method and an apparatus for estimating discharge power of a secondary battery.

The present application claims priority to Korean Patent Application No. 10-2014-0132312 filed on Oct. 1, 2014, the disclosure of which is incorporated herein by reference.

BACKGROUND ART

Many high-performance secondary battery applications require accurate estimation of available power supplied by the secondary battery. For example, in hybrid electric vehicles (HEV) and electric vehicles (EV), the vehicle controller continuously requests a battery management system (BMS) for update information on discharge power being supplied from the secondary battery to the motor and charge power that can be supplied to the secondary battery by way of motor or regenerative braking.

The Hybrid Pulse Power Characterization (HPPC) is the power calculation technology widely known in the art. The HPPC can be found in the Partnership for New Generation Vehicles (PNGB) Battery Test Manual (Rev. 3, February 2001) published by the Idaho National Engineering and Environment Laboratory of the U.S. Department of Energy.

The HPPC estimates secondary battery power by solely considering the operation design limits for voltage. Accordingly, this method does not consider the design limits associated with the state of charge (z) and currents of the secondary battery. The "state of charge" as used herein refers to a relative ratio of currently remaining capacity relative to the capacity of the fully-charged secondary battery.

The HPPC models the voltage of the secondary battery simply by Equation 1 below.

$$V = OCV(z) - RI \qquad \text{<Equation 1>}$$

where, OCV(z) denotes a corresponding open circuit voltage of the secondary battery when the state of charge of the secondary battery is z, and R is a constant representing internal resistance of the secondary battery. The parameter z representing the state of charge has a value ranging from 0 to 1.

FIG. 1 schematically illustrates the concept of determining discharge power of the secondary battery using HPPC.

As illustrated in FIG. 1, the voltage $V_{dis}$ of the secondary battery is measured after the secondary battery in state of charge $z_k$ is discharged for a predetermined time (e.g., 10 sec) with a constant current having a value $I_{dis}$. For convenience of description, $V_{dis}$ is hereinafter referred to as a "discharge termination voltage".

Next, the slope of I-V profile, $R_{dis}$, is determined based on Equation 1, and by using $R_{dis}$ as determined, the linear equation, $V = -R_{dis}*I + OCV(z_k)$, is determined regarding the I-V profile. The extrapolation is then applied to the determined equation such that the current value corresponding to $V_{min}$, the lower limit of the discharge voltage, is determined. In this manner, the maximum discharge current $I_{max,dis}$ is determined.

According to HPPC, when the maximum discharge current $I_{max,dis}$ is determined, the discharge power $P^{dis}$ is then determined with Equation 2 below.

$$P^{dis} = V_{min} I_{max,dis} = V_{min} \frac{OCV(z_k) - V_{min}}{R^{dis}} \qquad \text{<Equation 2>}$$

Meanwhile, the conventional discharge power calculation method described above has several shortcomings.

First, HPPC does not set the operation design limits for current. When the maximum discharge current $I_{max,dis}$ of the secondary battery determined by HPPC is greater than the operating current upper limit $I_{limit,dis}$ of the secondary battery, the discharge power is determined to be greater than the performance of the secondary battery. When this happens, the secondary battery will be discharged under a harsher than actual condition. Accordingly, this can be a threat to safety. In particular, the lithium secondary battery has a risk of explosion.

Further, HPPC assumes that the discharge resistance $R_{dis}$ corresponding to the slope of the I-V profile is a constant. However, the I-V profile can have non-linearity depending on types of secondary battery. In this case, the discharge power is also set to be greater than actual performance of the secondary battery.

FIG. 2 illustrates an example in which the I-V profile has non-linearity.

Referring to the example of FIG. 2, the discharge termination voltage of the secondary battery is measured to be $V_{dis}$ when the secondary battery is discharged with the discharge current $I_{dis}$ for a predetermined time. The maximum discharge current $I_{max,dis}$ calculated by using the discharge termination voltage and the discharge current measured by HPPC as described above becomes greater than the actual value $I^*_{max,dis}$ of the maximum discharge current. This is because $I_{max,dis}$, calculated with the extrapolation based on an assumption that the I-V profile has linearity, is greater than the value of the current $I^*_{max,dis}$ at the actual point of intersection between the I-V profile and the straight line $V = V_{min}$.

Accordingly, there is demand for a new discharge power estimation technology in the related field, which can overcome the shortcomings of HPPC mentioned above.

DISCLOSURE

Technical Problem

The present disclosure is designed to solve the problems of the related art, and therefore the present disclosure is directed to providing a new method for estimating discharge power which is capable of solving problems of HPPC.

The present disclosure is also directed to providing an apparatus capable of estimating discharge power of a secondary battery by using a look-up table constructed with the new method for estimating discharge power.

Technical Solution

In one aspect of the present disclosure, there is provided a method for estimating discharge power of a secondary battery, including (a) setting a discharge boundary condition that includes an discharge current upper limit and a discharge voltage lower limit of the secondary battery, (b) setting a state of charge of the secondary battery for which estimation of discharge power is intended, (c) discharging the secondary battery with different levels of discharge currents while measuring a discharge termination voltage corresponding to each of the discharge currents, and generating a current-voltage (I-V) profile that at least forms a point of intersection with the discharge boundary condition, by using a plurality of discharge currents and corresponding discharge termination voltages, (d) determining a current value and a voltage value corresponding to the point of intersection as a maximum discharge current and a final discharge voltage, respectively, and (e) determining a discharge power corresponding to the set state of charge of the secondary battery by using the maximum discharge current and the final discharge voltage.

According to one aspect, the method may include estimating the discharge power according to a plurality of states of charge by repeatedly performing the operations at (b) to (e) with respect to the secondary battery having different levels of states of charge.

According to another aspect, the method may include estimating the discharge power according to the state of charge and temperature by repeatedly performing the operations at (b) to (e) with respect to the secondary battery maintained at different temperatures.

According to yet another aspect, the method may additionally include determining a resistance corresponding to the state of charge of the secondary battery from a slope of a straight line that connects a Y-intercept of the I-V profile with the point of intersection.

In one aspect of the present disclosure, there is provided an apparatus for estimating discharge power of a secondary battery, including a storage unit storing therein a resistance look-up table that defines resistance according to a state of charge, wherein the resistance is determined by using a point of intersection at which a current-voltage (I-V) profile corresponding to the state of charge meets a discharge boundary condition, a sensor unit configured to measure a discharge current of the secondary battery during discharging of the secondary battery, and a control unit configured to determine the state of charge of the secondary battery, determine the resistance corresponding to the determined state of charge using the resistance look-up table, and estimate the discharge power of the secondary battery from the determined resistance and the measured discharge current.

Preferably, the resistance look-up table may be separately defined according to a temperature of the secondary battery. The sensor unit may further measure the temperature of the secondary battery, and the control unit may identify the resistance look-up table corresponding to the measured temperature, and determine the resistance corresponding to the estimated state of charge by using the identified resistance look-up table.

Preferably, the resistance corresponds to a slope of a straight line that connects the point of intersection with a Y-intercept of the I-V profile.

Preferably, the discharge boundary condition may include a discharge current upper limit and a discharge voltage lower limit.

According to one aspect, the apparatus may additionally include a storage unit connected to the control unit. In the above example, the control unit may store the estimated discharge power to the storage unit.

According to another aspect, the apparatus may additionally include a display unit connected to the control unit, in which case the control unit displays the estimated discharge power through the display unit.

According to yet another aspect, the apparatus may additionally include a communication interface connected to the control unit. In the above example, the control unit may externally transmit the estimated discharge power through the communication interface.

In another aspect of the present disclosure, there is provided an apparatus for estimating discharge power of a secondary battery, including a storage unit storing therein a maximum discharge power look-up table that defines maximum discharge power according to a state of charge, wherein the maximum discharge power is determined from current and voltage at a point of intersection at which a current-voltage (I-V) profile corresponding to the state of charge meets a discharge boundary condition, a sensor unit configured to measure a discharge current of the secondary battery during discharging of the secondary battery, and a control unit configured to determine the state of charge of the secondary battery, and determine the maximum discharge power corresponding to the determined state of charge using the maximum discharge power look-up table.

Preferably, the maximum discharge power look-up table may be separately defined according to a temperature of the secondary battery. The sensor unit may further measure the temperature of the secondary battery, and the control unit may identify the maximum discharge power look-up table corresponding to the measured temperature, and determines the maximum discharge power by using the identified maximum discharge power look-up table.

In yet another aspect of the present disclosure, there is provided a method for estimating discharge power of a secondary battery, including (a) loading a resistance look-up table that defines resistance according to a state of charge, wherein the resistance is determined by using a point of intersection at which a current-voltage (I-V) profile corresponding to the state of charge meets a discharge boundary condition, (b) measuring a discharge current of the secondary battery during discharging of the secondary battery, (c) determining the state of charge of the secondary battery, (d) determining the resistance corresponding to the determined state of charge by using the resistance look-up table, and (e) estimating a discharge power of the secondary battery from the determined resistance and the measured discharge current.

Preferably, the resistance look-up table may be separately defined according to a temperature of the secondary battery. In the above example, the operation at (b) may additionally include measuring a temperature of the secondary battery. Further, prior to the operation at (d), the method may include identifying a resistance look-up table that corresponds to the measured temperature from among a plurality of resistance look-up tables.

According to one aspect, the method may additionally include storing, displaying or transmitting the estimated discharge power.

In yet another aspect of the present disclosure, there is provided a method for estimating discharge power of a secondary battery, including (a) loading a maximum discharge power look-up table that defines maximum discharge power determined from current and voltage at a point of intersection at which a current-voltage (I-V) profile corresponding to the state of charge meets a discharge boundary condition, (b) determining the state of charge of the secondary battery, (c) determining the maximum discharge power corresponding to the determined state of charge using the maximum discharge power look-up table.

Preferably, the maximum discharge power look-up table may be separately defined according to a temperature of the secondary battery. In the above example, prior to the operation at (b), the method may additionally include measuring a temperature of the secondary battery. Further, the operation at (c) may additionally include identifying a maximum discharge power look-up table that corresponds to the measured temperature from among a plurality of maximum discharge power look-up tables.

According to one aspect, the method may additionally include storing, displaying or transmitting the estimated maximum discharge power.

Advantageous Effects

The present disclosure gives the following effects. According to an aspect of the present disclosure, safety can be enhanced during discharging of the secondary battery, since discharge power is estimated by considering both the discharge current upper limit and discharge voltage lower limit of the secondary battery.

According to another aspect of the present disclosure, it is enabled to estimate discharge power that meets the discharge performance of the secondary battery.

According to yet another aspect of the present disclosure, it is enabled to estimate discharge power that meets the performance of the secondary battery even in a state of charge segment in which the I-V profile of the secondary battery has non-linearity.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

In the description provided below, the secondary battery refers to the lithium secondary battery. The "lithium secondary battery" as used herein encompasses a secondary battery in which lithium ions act as the operating ions and thereby inducing electrochemical reaction in the positive electrode and the negative electrode during charging and discharging.

Accordingly, while the name of the secondary battery may vary according to a type of electrolyte or separator used in the lithium secondary battery, a type of packing material used for packing the secondary battery, or an interior or exterior structure of the lithium secondary battery, any secondary battery that uses lithium ions as the operating ions should be interpreted as falling under the scope of the lithium secondary battery.

The present disclosure is applicable to other secondary batteries as well as the lithium secondary battery. Accordingly, regardless of whether the operating ions are lithium ions or not, any secondary battery should be interpreted as being falling under the scope of the present disclosure without being limited in its kind, as long as it can apply the technical concept of the present disclosure.

Further, the secondary battery is not limited by the number of elements constructing the same. Accordingly, the secondary battery should be interpreted as encompassing not only a single cell including an assembly of a positive electrode/separator/negative electrode and electrolyte in a single package, but also an assembly of single cells, a module in which a number of assemblies are connected in series and/or in parallel, a pack in which a number of modules are connected in series and/or in parallel, a battery system in which a number of packs are connected in series and/or in parallel, and so on.

In an exemplary embodiment, a method for estimating discharge power of a secondary battery according to the present disclosure is implemented during a discharge power test process that follows after fabrication of the secondary battery.

Figure 1:
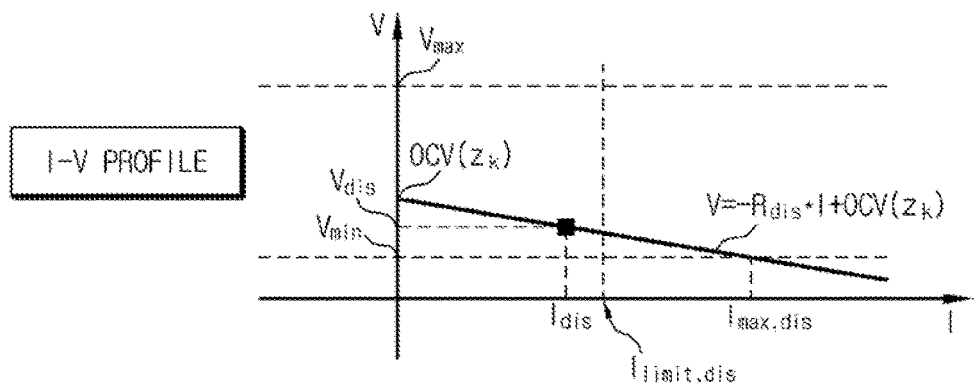
FIG. 1 exemplifies an I-V profile to explain a problem occurring when no discharge current upper limit is set when determining the discharge power of the secondary battery with Hybrid Pulse Power Characterization (HPPC).
Figure 2:
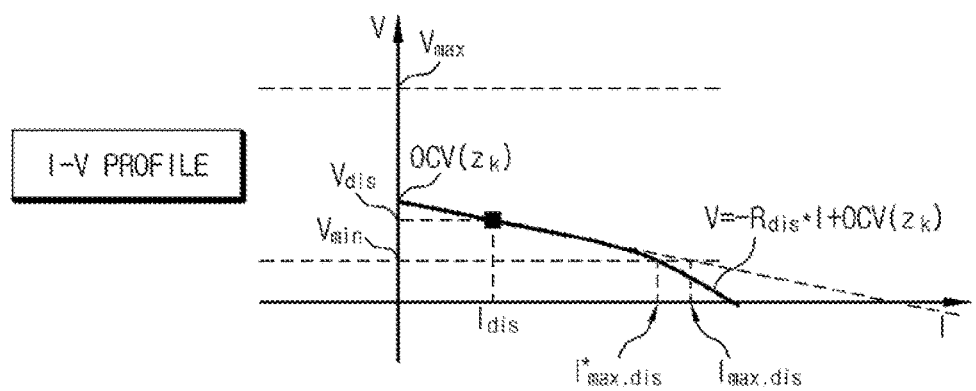
FIG. 2 is a diagram provided to explain a problem occurring when an I-V profile has non-linearity when determining the discharge power of the secondary battery with the HPPC.
Figure 3:
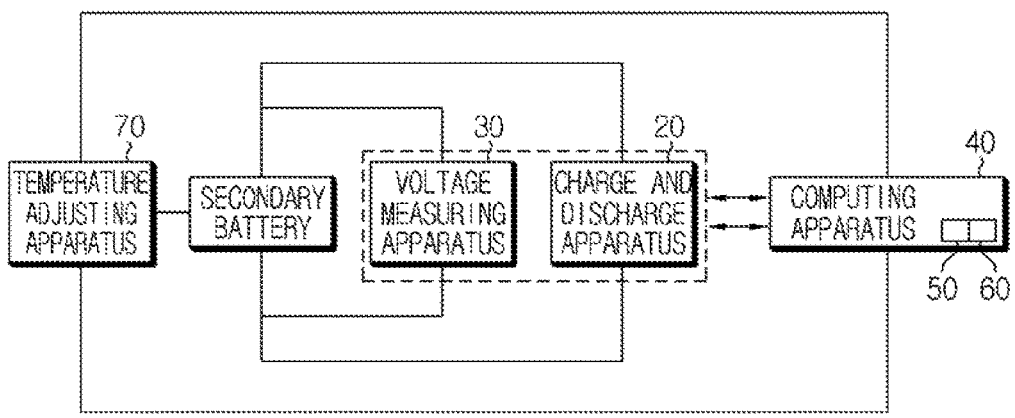
FIG. 3 schematically illustrates the configuration of a discharge test system according to an exemplary embodiment.

For the purpose of discharge power test of the secondary battery, a discharge test system 10 as the one illustrated in FIG. 3 may be provided.

The discharge test system 10 includes a charge and discharge apparatus 20 capable of discharging the secondary battery with an arbitrary discharge current for a predetermined time, or adjusting a state of charge of the secondary battery to a desired value.

Preferably, the charge and discharge apparatus 20 includes a functionality to discharge the secondary battery with pulsed constant current for a set period of time.

Further, the charge and discharge apparatus 20 includes a state-of-charge detection unit to detect the state of charge of the secondary battery, a charge unit to increase the state of charge, and a discharge unit to decrease the state of charge.

The discharge test system 10 includes a voltage measuring apparatus 30 to measure the discharge termination voltage of the secondary battery after discharging of the secondary battery by the charge and discharge apparatus 20 is finished.

Preferably, the voltage measuring apparatus 30 measures the discharge termination voltage by sensing the discharge current level reaching 0.

The discharge test system 10 includes a computing apparatus 40 connected to the charge and discharge apparatus 20 and the voltage measuring apparatus 30, and configured to set a discharge current level and a discharge time according to a request from a system operator, and receive the measured discharge termination voltage as an input from the voltage measuring apparatus 30.

Preferably, the computing apparatus 40 includes a memory 50 to store the discharge termination voltage corresponding to each of the discharge currents in a form of digital data, and includes a program 60 to test the discharge power according to an exemplary embodiment of the present disclosure.

Figure 4:
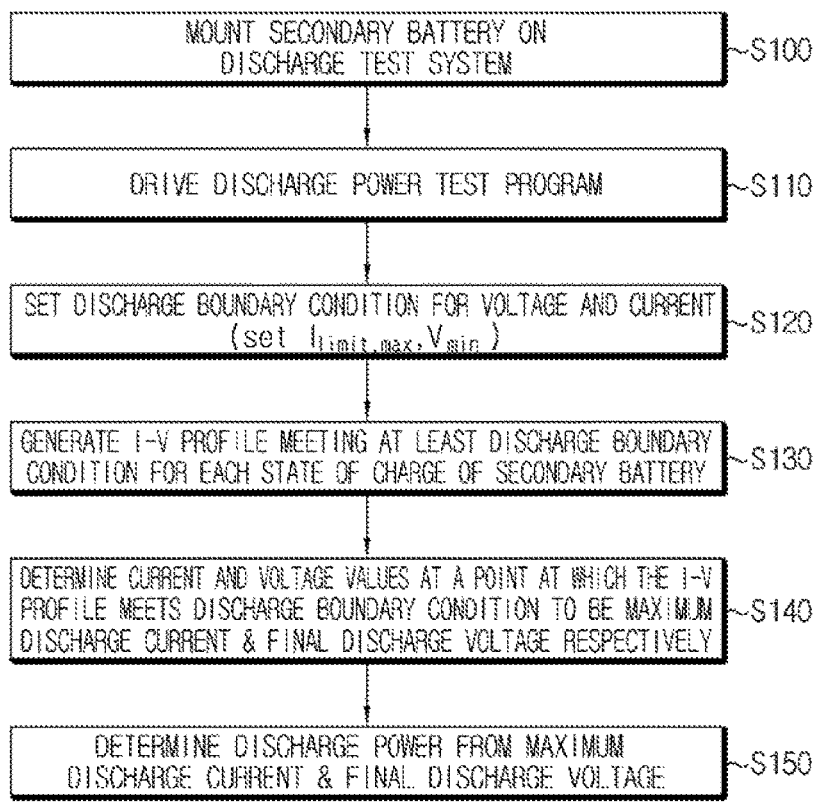
FIG. 4 is a flowchart illustrating a sequence of a method for estimating discharge power with the discharge test system of FIG. 3.

FIG. 4 is a sequence flowchart of a method for estimating discharge power of a secondary battery using a discharge test system 10.

Referring to FIG. 4, at S100, the system operator first mounts a secondary battery on a discharge test system 10, and then drives the discharge power test program 60 on the computing apparatus 40, at S110.

Next, at S120, a discharge boundary condition is set with the discharge power test program. The discharge boundary condition includes a discharge current upper limit $I_{limit,max}$, and a discharge voltage lower limit $V_{min}$.

When setting the discharge boundary condition is completed, the operator instructs to generate an I-V profile for each state of charge used in the discharge power estimation.

Accordingly, at S130, the computing apparatus 40 generates I-V profile of each state of charge of the secondary battery that meets the discharge boundary condition, by implementing algorithms of the discharge power test program 60 and thereby controlling the charge and discharge apparatus 20 and the voltage measuring apparatus 30.

Figure 5:
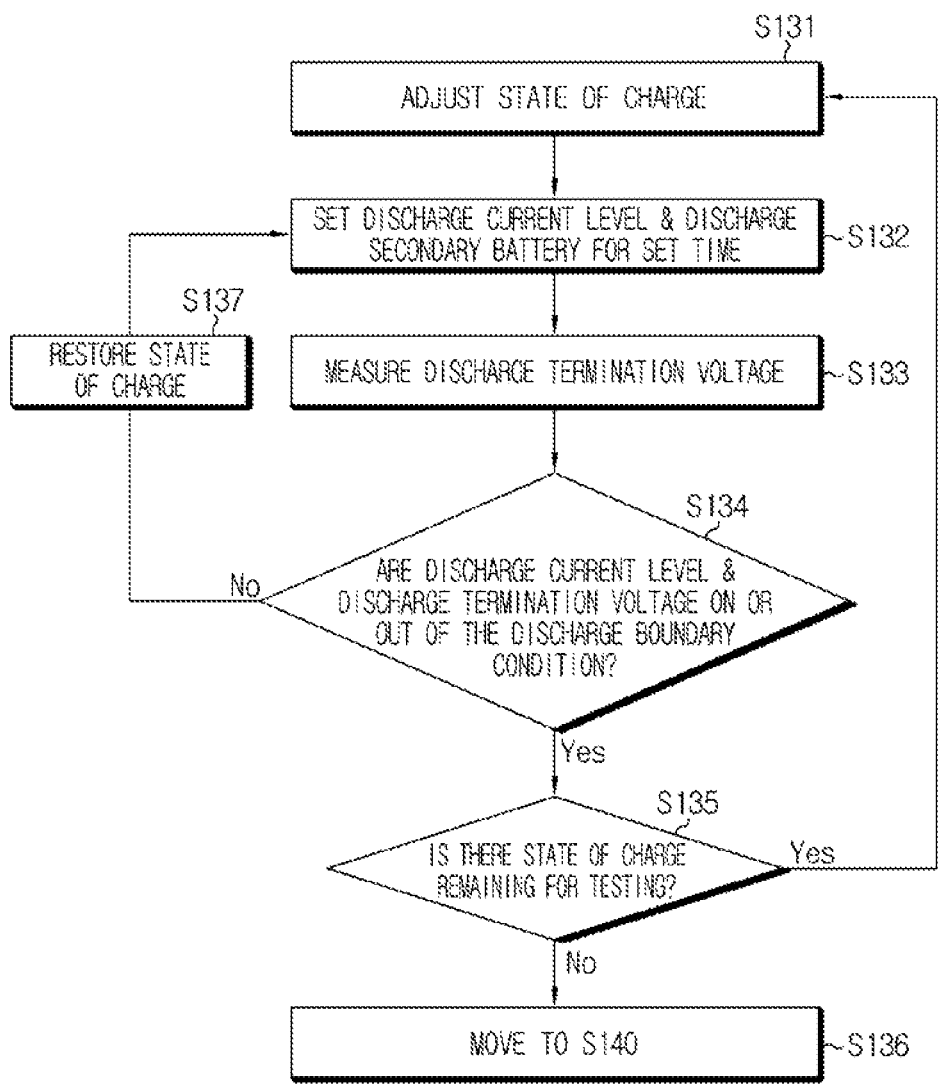
FIG. 5 is a flowchart illustrating in detail the operation at S130 of the flowchart of FIG. 4.

FIG. 5 is a sequence flowchart illustrating in more detail the process of generating I-V profile of each state of charge of the secondary battery according to an exemplary embodiment of the present disclosure.

Referring to FIG. 5, at S131, the computing apparatus 40 first controls the charge and discharge apparatus 20 to adjust the state of charge of the secondary battery. At this time, the state of charge is adjusted to 1 (100%), the highest value of a plurality of preset values.

Next, at S132, the computing apparatus 40 controls the charge and discharge apparatus 20 to set the discharge current level, and discharges the secondary battery for a preset period of time. At this time, the discharge current level is the lowest level among a plurality of preset level values.

The computing apparatus 40 then controls the voltage measuring apparatus 30 to measure the discharge termination voltage, and receives the measured result, at S133. At S134, the computing apparatus 40 then determines if the discharge current level and the discharge termination voltage are on the discharge boundary or out of the discharge boundary.

If the determination at S134 indicates NO, the computing apparatus 40 moves the process to S137 and controls the charge and discharge apparatus 30 to restore the state of charge of the secondary battery to a value before when discharging has begun. The computing apparatus 40 then moves the process to S132, again sets the discharge current level and performs the operation of discharging the secondary battery for the set period of time. At this time, the discharge current level is set to a greater value next to the previously-used value among the several preset values. Then the operations at S132, S133, S134 and S137 are repeatedly performed until the determination at S134 indicates YES.

Meanwhile, when determination at S134 indicates YES, because it means that the I-V profile that meets at least the discharge boundary condition is obtained regarding the state of charge for which the current discharge test is conducted, the process is moved to S135 to determine whether or not there is the state of charge remaining for testing.

When the determination at S135 indicates YES, the computing apparatus 40 moves to S131 and re-adjusts the state of charge. At this time, the adjusted state of charge is immediately after (i.e., lower than) the previous state of charge among a plurality of preset states of charge. The same process described above is then repeatedly performed for the adjusted state of charge.

Meanwhile, when the determination at S135 indicates NO, because it means that there is no remaining state of charge for testing, it is considered that the generation of the I-V profile that meets at least the discharge boundary condition for each state of charge of the secondary battery is completed. Accordingly, the subsequent operation S140 is performed.

Referring again to FIG. 4, the computing apparatus 40 sets the current value and the voltage value of a point at which the I-V profile generated for each state of charge at S140 meets the discharge boundary condition, to be the maximum discharge current and final discharge voltage for use in calculating discharge power.

Next, the computing apparatus 40 determines discharge power by using the maximum discharge current and final discharge voltage set for each state of charge, and stores the determined discharge power at the memory 50.

Optionally, the computing apparatus 40 may determine a slope of an I-V line connecting a Y-intercept with a point of intersection with the discharge boundary, for each I-V profile, and store the determined slope in the memory 50 as a resistance of a secondary battery that corresponds to the state of charge. For reference, the Y-intercept corresponds to an open circuit voltage because it is a voltage at a point of intersection between the I-V profile and Y-axis, that is, it is the voltage when current is 0.

Optionally, the discharge test system 10 according to the present disclosure may additionally include a temperature adjusting apparatus 70 to maintain the secondary battery at a constant temperature while discharge test is being conducted.

In this case, the computing apparatus 40 may control the temperature adjusting apparatus 70 to maintain the temperature of the secondary battery at a constant value when the discharge test is being conducted. Further, the computing apparatus 40 may repeatedly perform operations disclosed in FIG. 4 with a plurality of temperature conditions, and may also determine resistance of the secondary battery corresponding to each state of charge with a plurality of temperature conditions and store the result in the memory 50.

Figure 6:
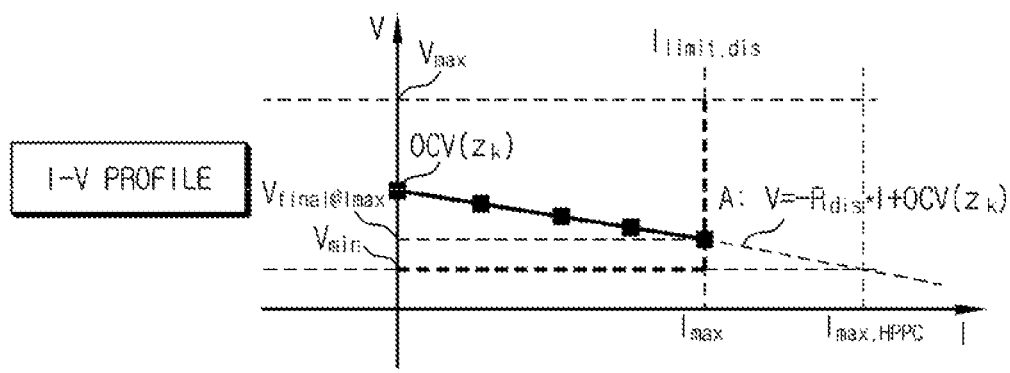
FIGS. 6 to 8 exemplify I-V profiles generated according to an exemplary embodiment.
Figure 7:
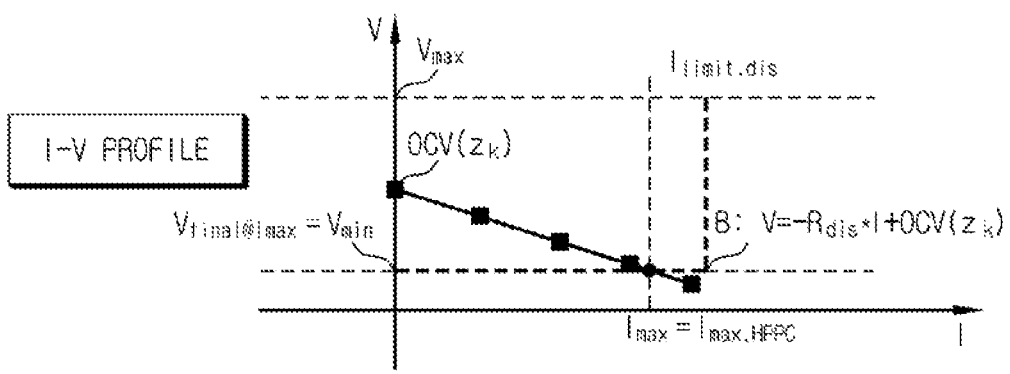
Figure 8:
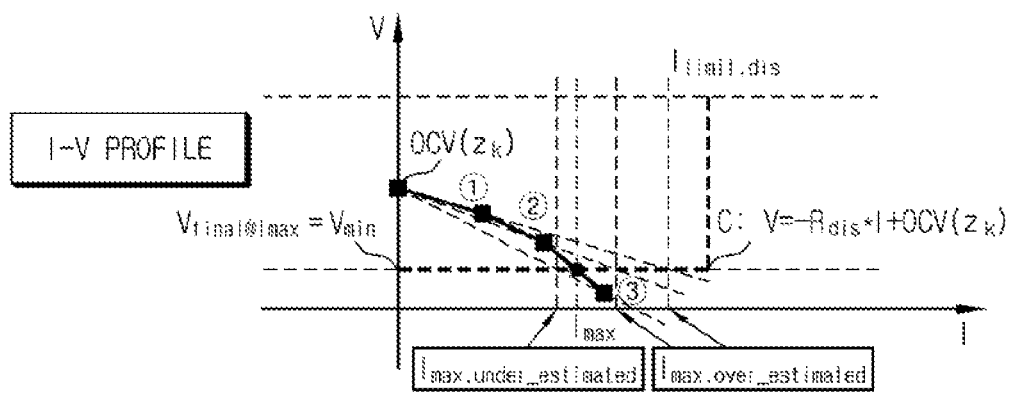

FIGS. 6 to 8 are graphs exemplifying I-V profiles that can be generated with the discharge test system 10. In each drawing, the bold dotted line represents the discharge boundary condition. The vertical line of the discharge boundary condition represents the discharge current upper limit, and the horizontal line of the discharge boundary condition represents the discharge voltage lower limit.

First, FIG. 6 shows I-V profile A obtained for the secondary battery with state of charge $z_k$. I-V profile A has a linearity. The discharge power corresponding to the I-V profile A may be obtained by substituting into Equation 3 below a maximum discharge current ($I_{max}$) at a point where the I-V profile A meets $I=I_{max}$ corresponding to the vertical line of the discharge boundary condition, and the corresponding final discharge voltage ($V_{final@Imax}$).

$$P^{dis} = V_{final@Imax} I_{max} \qquad \text{<Equation 3>}$$

The maximum discharge current ($I_{max}$) is lower than the maximum discharge current ($I_{max,HPPC}$) obtained by extrapolation according to HPPC. Further, the discharge power, which is determined by using a point at which the I-V profile meets the discharge boundary condition, best matches the current performance of the secondary battery. Accordingly, within the performance range of the secondary battery, it is possible to control discharging of the secondary battery more safely.

Next, FIG. 7 exemplifies I-V profile B that has linearity and meets the horizontal line ($V=V_{min}$) of the discharge boundary condition. The discharge power corresponding to the I-V profile B may be obtained by substituting into Equation 3 above a maximum discharge current ($I_{max}$) at a point where the I-V profile B meets the horizontal line ($V=V_{min}$) of the discharge boundary condition, and the corresponding final discharge voltage ($V_{final@Imax}$).

Note that, because I-V profile B has linearity and meets the horizontal line of the discharge boundary condition, the maximum discharge current ($I_{max}$) is same as the maximum discharge current ($I_{max,HPPC}$) as obtained with extrapolation by using HPPC. Accordingly, the discharge power obtained from the I-V profile B is the same as the discharge power obtained by the conventional HPPC.

FIG. 8 exemplifies I-V profile C having non-linearity. The I-V profile C meets $V=V_{min}$ that corresponds to the horizontal line of the discharge boundary condition. The I-V profile C includes three discharge data expressed as ① to ③. Each discharge data may be used when estimating maximum discharge current with the HPPC. However, the maximum discharge current estimated with HPPC has a difference from the maximum discharge current ($I_{max}$) at a point where the I-V profile C meets $V=V_{min}$ that corresponds to the horizontal line of the discharge boundary condition. That is, the maximum discharge current ($I_{max,over\_estimated}$) Obtained with data ① and ③ by using HPPC is greater than actual maximum discharge current ($I_{max}$). Further, the maximum discharge current ($I_{max,under\_estimated}$) obtained with data ③ by using HPPC is lower than actual maximum discharge current ($I_{max}$). Accordingly, while the discharge power calculated based on the maximum discharge current as the current value at a point where the I-V profile meets the discharge boundary condition may match the performance of the secondary battery, the discharge power estimated from the maximum discharge current determined by the HPPC may be higher or lower than the performance of the secondary battery.

Figure 9:
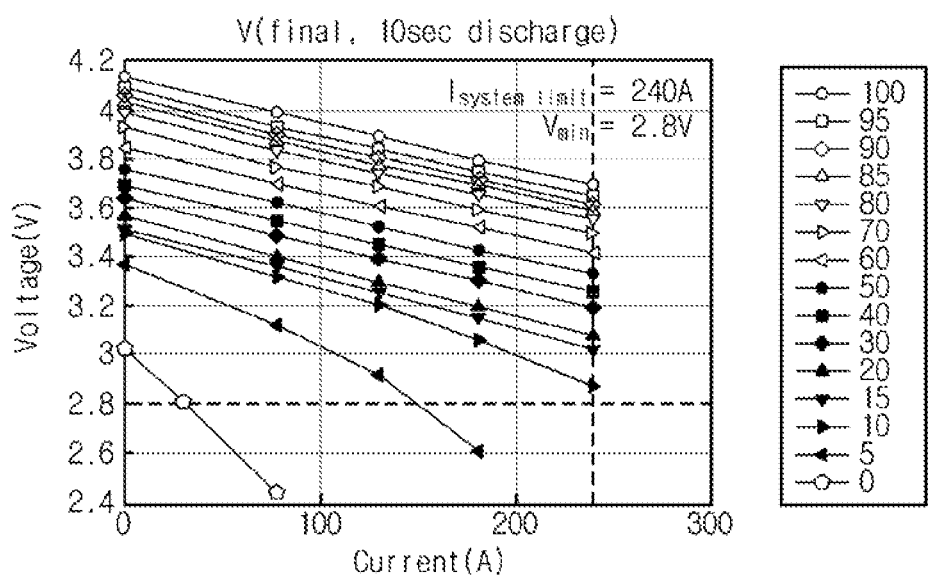
FIG. 9 exemplifies I-V profiles generated per state of charge of a lithium secondary battery according to an exemplary embodiment.

FIG. 9 exemplifies I-V profiles generated with the method disclosed in FIG. 4 with respect to a lithium secondary battery including lithium transition metal oxide ($LiNi_xMn_yCo_zO_2$) and graphite in the positive electrode and the negative electrode, and having 26 Ah capacity, across the entire state of charge segments and at room temperature (e.g., 25° C.).

In the present embodiment, the horizontal line of the discharge boundary condition is V=2.8V, and the vertical line of the discharge boundary condition is I=240A.

Referring to the abstract shape of the I-V profile appearing in FIG. 9, the I-V profiles measured in a high state-of-charge segment have strong linearity. In contrast, as the state of charge becomes lower, the non-linearity of the I-V profiles increase.

As discharge continues, lithium ions are intercalated into the positive electrode. But as the state of charge is lowered to a certain level, intercalation of the lithium ions into the positive electrode becomes increasingly difficult, and the resistance of the secondary battery increases as a result. Such effect of increasing resistance at the positive electrode increases as the discharge current increases.

For one example, referring to I-V profile when the state of charge is 5%, the resistance of the secondary battery corresponding to the slope of the profile is gradually increased as the discharge current increases.

Meanwhile, the present disclosure can estimate the secondary battery power in real time, by defining the resistance per state of charge of the secondary battery with the I-V profiles described so far.

Figure 10:
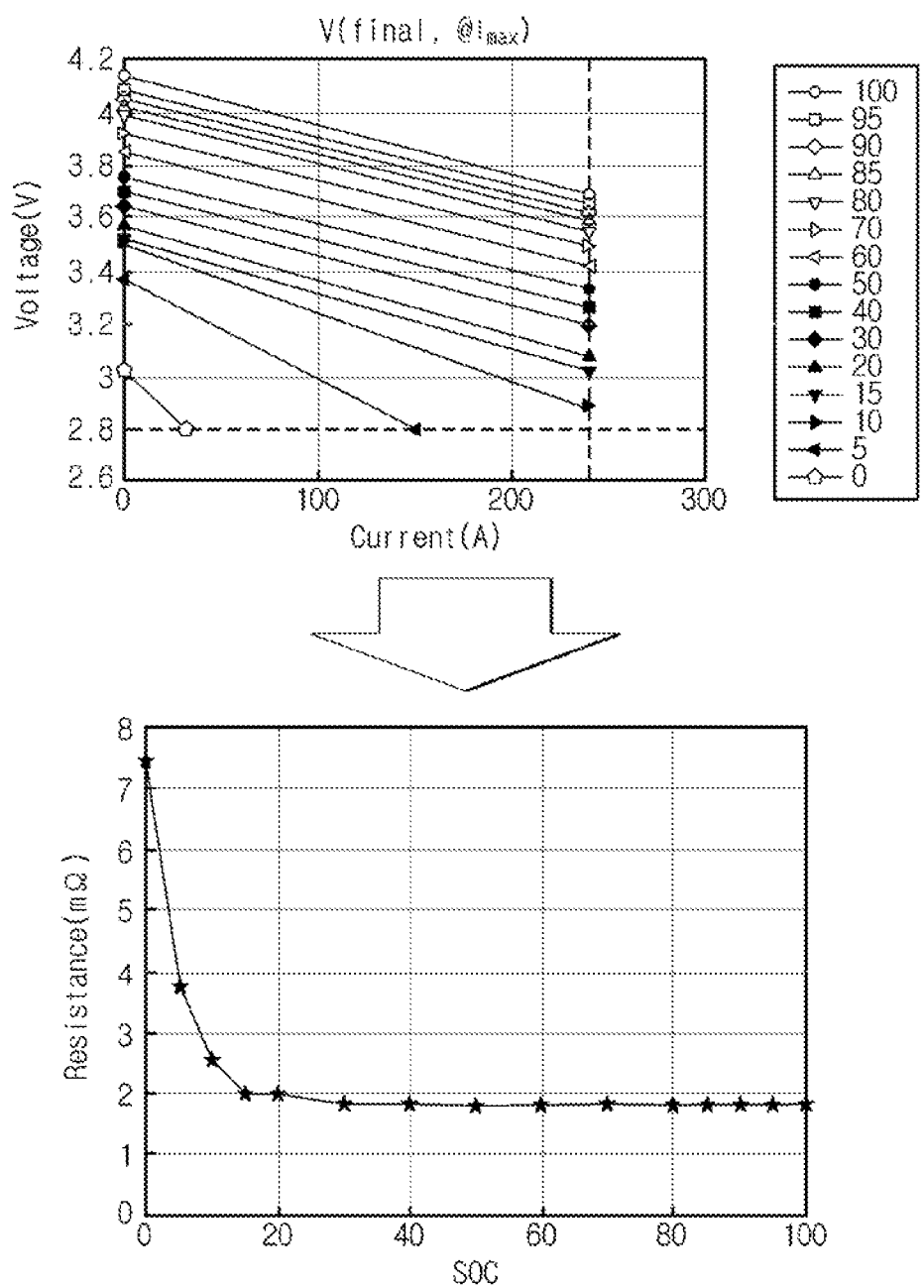
FIG. 10 exemplifies a resistance profile generated with the I-V profiles of FIG. 9.

The graph in the upper half of FIG. 10 shows lines (hereinafter, "I-V lines") connecting two dots at which each of the I-V profiles per state of charge exemplified in FIG. 9 meets the discharge boundary condition and Y-axis.

The present disclosure may define the resistance value of the secondary battery to be a slope of each I-V line when the secondary battery has a state of charge that corresponds to each I-V line.

The graph in the lower half of FIG. 10 shows resistance profile representing the resistance obtained from the slope of each I-V line according to the state of charge of the secondary battery. With reference to the abstract shape of the resistance profile, the resistance of the secondary battery is almost constant while the state of charge is being decreased to the proximity of 20%, and then the resistance of the secondary battery gradually increases once the state of charge is lowered below 20%.

Preferably, the resistance profile such as the graph shown in the lower half of FIG. 10 may be generated per temperature of the secondary battery. That is, the resistance profiles per temperature may be generated by obtaining a number of I-V profiles that meet the discharge boundary condition at a plurality of different temperatures.

The resistance profile according to the state of charge of the secondary battery, or the resistance profile according to temperature and state of charge of the secondary battery may be used for estimating the discharge power of the secondary battery in real time.

Figure 11:
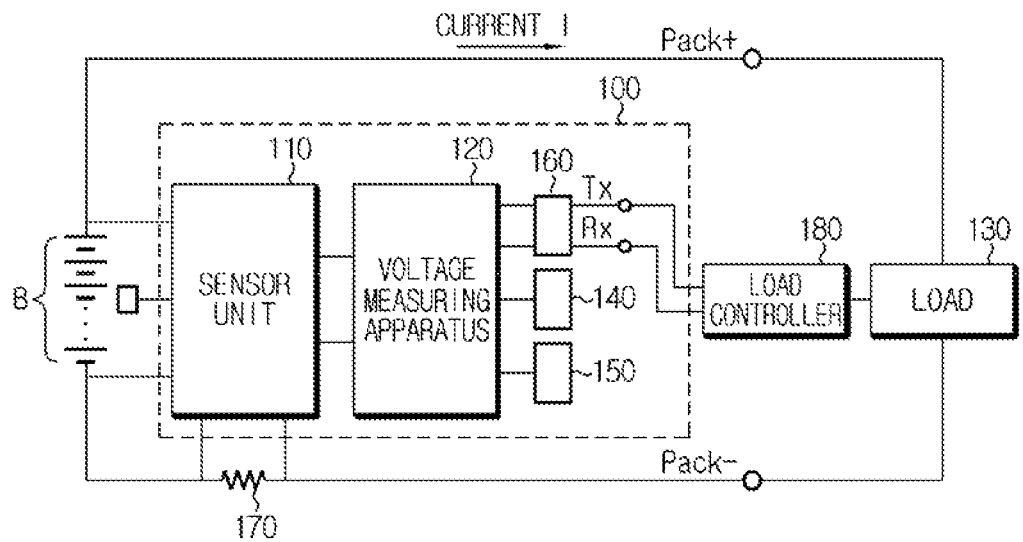
FIG. 11 schematically illustrates the configuration of an apparatus for estimating discharge power of a secondary battery according to an exemplary embodiment.

FIG. 11 is a block diagram schematically illustrating a configuration of an apparatus 100 for estimating a discharge power of a secondary battery according to an embodiment of the present disclosure.

Referring to FIG. 11, the apparatus 100 for estimating discharge power includes a sensor unit 110 and a control unit 120, and is electrically connected with the secondary battery B to estimate discharge power of the secondary battery B while the secondary battery B is being discharged.

The secondary battery B is electrically connected with load 130. The load 130 is included in a variety of electrically-driven apparatuses described above, and it refers to an energy consuming device included in the electrically-driven apparatuses operated on electrical energy supplied during discharging of the secondary battery B.

The load 130 may be, without limitation, a rotary power device such as a motor, a power converting device such as an inverter, and so on, although the present disclosure is not limited to a specific type of the load 130.

Preferably, the apparatus 100 for estimating discharge power may include a storage unit 140. The storage unit 140 is not limited to any specific type of storage medium as long as it can record and erase information.

In one example, the storage unit 140 may be RAM, ROM, register, hard disk, optical recording medium, or magnetic recording medium.

Preferably, the storage unit 140 may be connected with the control unit 120 via, for example, data bus, and so on to allow access for the control unit 120.

The storage unit 140 stores and/or updates and/or erases and/or transmits program including various control logics implemented by the control unit 120 and/or the data that is generated when the control logics are implemented.

The storage unit 140 is logically dividable into two or more, and included in the control unit 120 without limitation.

Preferably, the storage unit 140 may store a resistance look-up table that defines resistance per state of charge of the secondary battery B. In a more preferable example, the resistance look-up table may be separately defined per temperature. The resistance look-up table per temperature may be constructed by obtaining the resistance profile illustrated in FIG. 10 per temperature.

The resistance per state of charge described above is derived from the resistance profile exemplified on the graph in the lower half of FIG. 10. That is, the resistance corresponding to a specific state of charge included in the resistance look-up table corresponds to a slope of an I-V line that connects two dots at which the I-V profile corresponding to the specific state of charge meets the discharge boundary condition and the Y-axis.

The sensor unit 110 is electrically and operatively coupled with the control unit 120 such that the sensor unit 110 can send and receive electrical signals with the control unit 120.

Under control of the control unit 120, the sensor unit 110 repeatedly measures voltages applied between the positive electrode and the negative electrode of the secondary battery B, currents of the secondary battery B, and temperature of the secondary battery B at time intervals, and outputs the measured voltage, current and temperature to the control unit 120. In this case, the voltage, current, and temperature may be measured at the same time point or at different time points.

The sensor unit 110 may include a voltage measuring means to measure the voltage of the secondary battery B, a current measuring means to measure the current of the secondary battery B, and a temperature measuring means to measure the temperature of the secondary battery B.

In one example, the voltage measuring means may include a general conventional voltage measuring circuit that senses the voltage of the secondary battery with reference to the ground. Further, the current measuring means may include a sense resistor 170 to measure the current level. Further, the temperature measuring means may include a thermocouple to measure the temperature of the secondary battery.

The control unit 120 receives the result of measuring the voltage, current and temperature of the secondary battery B from the sensor unit 110, and then estimates the state of charge of the secondary battery.

In one example, the control unit 120 may estimate the state of charge of the secondary battery B with ampere counting. The ampere counting estimates the state of charge of the secondary battery B by integrating the current measured by the sensor unit 110 with respect to time.

In another example, the control unit 120 may adaptively estimate the state of charge of the secondary battery B with the Extended Kalman Filter. In this case, the voltage, current and temperature measured by the sensor unit 110 may be used. The technique to estimate the state of charge with the Extended Kalman Filter is well known in the art. For example, the technologies disclosed in U.S. Pat. Nos. 7,446,504, 7,589,532, etc. may be utilized.

The control unit 120 may estimate the discharge power by using the resistance look-up table that is stored in the storage unit 140 while the secondary battery B is being discharged. That is, the control unit 120 may identify the resistance look-up table that corresponds to the measured temperature of the secondary battery B, determines the resistance corresponding to the estimated state of charge from the identified resistance look-up table, and estimate the discharge power of the secondary battery B by Equation 4 below using the determined resistance and the measured current of the secondary battery.

$$P^{dis} = R_{dis,soc} I^2 \qquad \text{<Equation 4>}$$

where, $P^{dis}$ denotes the discharge power of the secondary battery B, $R_{dis,soc}$ is the resistance corresponding to the temperature and state of charge of the secondary battery B, and I is the measured current of the secondary battery B and it corresponds to the discharge current level.

The discharge power calculated by Equation 4 has an advantage of little error as it is calculated by using current which is easy to measure. During discharging of the secondary battery, it is difficult to have accurate voltage measurement because of internal resistance and polarization voltage of the secondary battery. Accordingly, it is more preferred to calculate the discharge power by using current.

The control unit 120 may store the estimated discharge power of the secondary battery B and the historic variations of the discharge power in the storage unit 140.

In another aspect, the apparatus 100 for estimating discharge power may additionally include a display unit 150. The display unit 150 is not limited to any specific type, as long as it can display discharge power estimated at the control unit 120 as graphic user interface (GUI) such as numbers, texts, graphics, and so on.

In one example, the display unit 150 may be a liquid crystal display, an LED display, an OLED display, an E-INK display, a flexible display, and so on.

The display unit 150 may be connected with the control unit 120 directly or indirectly. In the latter case, the display unit 150 may be located at an area physically separated from an area where the control unit 120 is located. Further, a third-party control unit may be disposed between the display unit 150 and the control unit 120 such that the third-party control unit may receive from the control unit 120 information to be expressed on the display unit 150 and express the received information through the display unit 150. To this purpose, the third-party control unit and the control unit 120 may be connected for transmission and reception of data.

In yet another aspect, the apparatus 100 for estimating discharge power may additionally include a communication interface 160. The communication interface 160 supports transmission and reception of data between the control unit 120 and a load controller 180 for controlling the operations of the loads 130. In such example, the control unit 120 may transmit the estimated discharge power of the secondary battery B to the load controller 180. The load controller 180 may then control the operations of the secondary battery B and/or loads 130 using the discharge power of the secondary battery B.

In yet another aspect, the control unit 120 may estimate a maximum discharge power corresponding to the estimated state of charge of the secondary battery B and the measured temperature of the secondary battery B.

To this purpose, the storage unit 140 may additionally include a maximum discharge power look-up table defining maximum discharge power per state of charge of the secondary battery B. The maximum discharge power per state of charge included in the look-up table is a value determined by using the discharge test system 10 illustrated in FIG. 3. In such example, the control unit 120 may determine the maximum discharge power corresponding to the estimated state of charge by mapping from the maximum discharge power look-up table.

In a more preferable example, the maximum discharge power look-up table may be defined separately according to temperature of the secondary battery B. That is, I-V profile per state of charge may be obtained under different temperature conditions, and the maximum discharge power may be determined by substituting into Equation 3 the maximum discharge current and final discharge voltage at a point at which each I-V profile meets the discharge boundary condition, and the look-up table under corresponding temperature condition may be constructed with the maximum discharge power determined for each state of charge.

In such example, the control unit 120 may identify the maximum discharge power look-up table corresponding to the measured temperature of the secondary battery B, and may estimate the maximum discharge power corresponding to the measured temperature and the estimated state of charge by mapping the maximum discharge power corresponding to the state of charge estimated from the identified maximum discharge power look-up table.

The control unit 120 may store the estimated maximum discharge power to the storage unit 140, or display it through the display unit 150, or transmit it to the load controller 180 through the communication interface 160.

In order to implement a variety of control logics including those described above, the control unit 120 may optionally include a known processor, application-specific integrated circuit (ASIC), other chipsets, logic circuit, register, communication modem, data processor, and so on. Further, when the control logic is implemented as software, the control unit 120 may be implemented as a set of program modules. In this case, the program modules may be stored at a memory and executed by the processor. The memory may be internal or external to the processor and may be connected with the processor with a variety of known computer components. Further, the memory may be included in the storage unit 140 of the present disclosure. Further, the 'memory' collectively refers to any type of devices where information is stored, and is not intended to refer to any specific memory device.

It is apparent that the control logics of the control unit 120 may construct process of a method for estimating discharge power of a secondary battery according to embodiments of the present disclosure.

Figure 12:
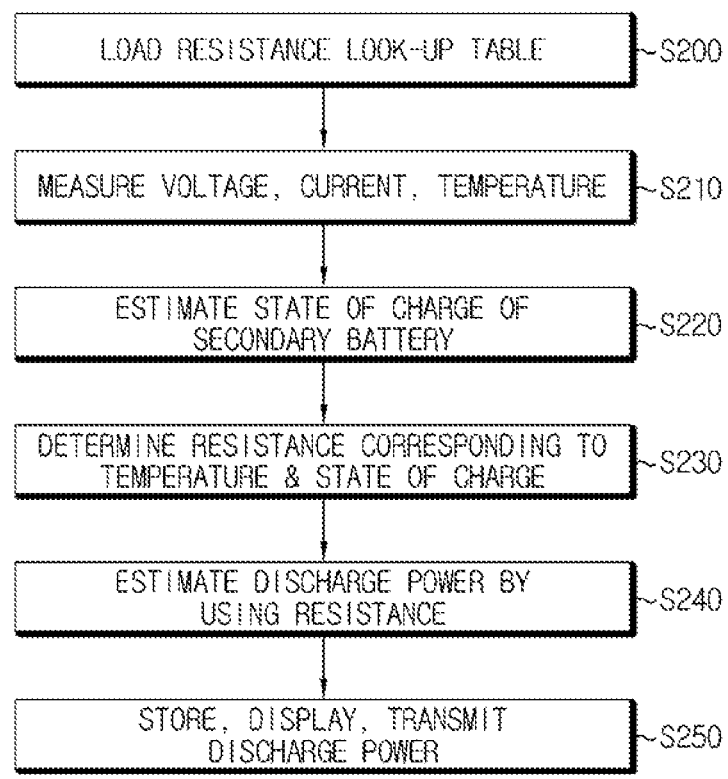
FIG. 12 is a flowchart illustrating a sequence of a method for estimating discharge power of a secondary battery according to an exemplary embodiment.

FIG. 12 is a flowchart illustrating sequence of a method for estimating discharge power of a secondary battery according to an exemplary embodiment of the present disclosure.

First, at S200, the control unit 120 loads the resistance look-up table from the storage unit 140. The resistance look-up table defines the resistance of the secondary battery per state of charge. Preferably, the resistance look-up table is separately defined according to temperature conditions.

Next, the control unit 120 measures the voltage, current and temperature of the secondary battery through the sensor unit 110 at S210, stores the result in the storage unit 140, and estimates the state of charge of the secondary battery at S220.

Next, at S230, the control unit 120 identifies the resistance look-up table corresponding to the measured temperature, and determines the resistance corresponding to the estimated state of charge by using the identified resistance look-up table.

The control unit 120 then estimates the discharge power of the secondary battery with Equation 4 by using the determined resistance and the measured discharge current.

Optionally, the control unit 120 may store the estimated discharge power to the storage unit 140, or display it through the display unit 150, or externally transmit it through the communication interface 160, at S250.

In another aspect, the control unit 120 may selectively load a maximum discharge power look-up table at S200. The maximum discharge power look-up table defines the maximum discharge power of the secondary battery according to state of charge. In a preferable example, the maximum discharge power look-up table may be defined separately according to temperature condition.

In such example, the control unit 120 may identify the maximum discharge power look-up table corresponding to the measured temperature of the secondary battery, and may estimate the maximum discharge power by mapping the maximum discharge power corresponding to the state of charge estimated from the identified maximum discharge power look-up table.

Further, the control unit 120 may store the estimated maximum discharge power to the storage unit 140, or display it through the display unit 150, or externally transmit it through the communication interface 160.

One or more of a variety of control logics of the control unit 120 may be combined, and the combined control logics may be written as a computer-readable code system and recorded on a computer-readable recording medium. The recording medium is not limited to any specific type, as long as it is accessible by a processor included in the computer. In one example, the recording medium may include at least one selected from the group consisting of ROM, RAM, register, CD-ROM, magnetic tape, hard disk, floppy disk, and optical data recording device. Further, the code system may be modulated into carrier signals and included in the communication carriers at a specific time point, and distributed over a networked computer and stored and executed therein. Further, programmers in the technical field pertinent to the present disclosure will be easily able to envision functional programs, codes and code segments to implement the combined control logics.

In describing a variety of aspects of the present disclosure, the elements with names ending with 'unit' will have to be understood as the elements that are distinguished functionally, rather than being distinguished physically. Accordingly, the respective elements may be optionally incorporated with another element, or each of the elements may be divided into sub-elements such that the respective elements efficiently implement control logic(s). However, even when the elements are incorporated or divided, it will be obvious to those skilled in the art that the incorporated or divided elements also fall under the scope of the present disclosure, as long as the sameness of functions is acknowledged.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

INDUSTRIAL APPLICABILITY

The present disclosure gives the following effects. According to an aspect of the present disclosure, safety can be enhanced during discharging of the secondary battery, since discharge power is estimated by considering both the discharge current upper limit and discharge voltage lower limit of the secondary battery.

According to another aspect of the present disclosure, it is enabled to estimate discharge power that meets the discharge performance of the secondary battery.

According to yet another aspect of the present disclosure, it is enabled to estimate discharge power that meets the performance of the secondary battery even in a state of charge segment in which the I-V profile of the secondary battery has non-linearity.

What is claimed is:

1. A method for estimating discharge power of a lithium secondary battery, comprising:
   (a) setting a discharge boundary condition that includes a discharge current upper limit $)I_{limit,max}$ and a discharge voltage lower limit ($V_{min}$) of the secondary battery;
   (b) setting each state of charge among a plurality of states of charge of the secondary battery for which the estimation of the discharge power is intended;
   (c) discharging the secondary battery with a plurality of different pulsed discharge currents while measuring a discharge termination voltage corresponding to each of the plurality of different pulsed discharge currents, and generating a current-voltage (I-V) profile for each state of charge among the plurality of states of charge that at least forms a point of intersection with the discharge boundary condition, by using the plurality of different pulsed discharge currents and the corresponding discharge termination voltages, wherein I-V profiles corresponding to the plurality of states of charge increase in non-linearity as the corresponding states of charge decrease;
   (d) determining a current value (I) and a voltage value (V) corresponding to the point of intersection as a maximum discharge current ($I_{max}$) and a final discharge voltage ($V_{final@Imax}$), respectively, wherein the point of intersection is located on $V=V_{min}$ or $I=I_{limit,max}$ depending on the state of charge of the secondary battery, and wherein the maximum discharge current ($I_{max}$) is lower than a corresponding maximum discharge current ($I_{max,HPPC}$) obtained by extrapolation according to a hybrid pulse power characterization (HPPC); and
   (e) determining the discharge power corresponding to the state of charge of the secondary battery by using the maximum discharge current and the final discharge voltage.

2. The method of claim 1, comprising estimating the discharge power according to each state of charge among the plurality of states of charge and a corresponding temperature by repeatedly performing the operations at (b) to (e) with respect to the secondary battery maintained at different temperatures.

3. The method of claim 1, further comprising determining a resistance corresponding to the state of charge of the secondary battery from a slope of a straight line that connects a Y-intercept of the I-V profile with the point of intersection.

4. The method according to claim 1, wherein step (c) further comprises:
   (c)(1) adjusting the state of charge to one state of charge among the plurality of predetermined states of charge;
   (c)(2) setting a discharge current level and discharging the secondary battery for a preset period of time at the discharge current level;
   (c)(3) measuring the discharge termination voltage and determining the discharge current level;
   (c)(4) in response to the discharge current level and the discharge termination voltage being on the discharge boundary condition, repeating steps (c)(1)-(c)(4) for all remaining states of charge among the plurality of states of charge, and if there are no remaining states of charge, proceed to step (d);
   in response to the discharge current level and the discharge termination voltage being out of the discharge boundary condition, restoring the state of charge to the one state of charge and repeating steps (c)(2) to (c)(4), wherein in step (c)(2), the discharge current level being set to a greater value than previously used.

5. An apparatus for estimating discharge power of a lithium secondary battery, comprising:
   a storage unit storing therein a resistance look-up table that defines a resistance for each state of charge among a plurality of states of charge, wherein the resistance is determined by using a point of intersection at which a current-voltage (I-V) profile corresponding to each state of charge meets a discharge boundary condition;
   a sensor unit configured to measure a discharge current of the secondary battery during discharging of the secondary battery; and
   a control unit configured to determine a state of charge of the secondary battery, determine the resistance corresponding to the determined state of charge using the resistance look-up table, and estimate the discharge power of the secondary battery from the determined resistance and the measured discharge current,
   wherein I-V profiles corresponding to the plurality of states of charge increase in non-linearity as the corresponding states of charge decrease, such that a maximum discharge current of the secondary battery determined by Hybrid Pulse Power Characterization (HPPC) is greater than an operating current upper limit of the secondary battery.

6. The apparatus of claim 5, wherein the resistance look-up table is separately defined according to a temperature of the secondary battery,
   the sensor unit further measures the temperature of the secondary battery, and
   the control unit identifies the resistance look-up table corresponding to the measured temperature, and determines the resistance corresponding to the state of charge by using the identified resistance look-up table.

7. The apparatus of claim 5, wherein the resistance corresponds to a slope of a straight line that connects the point of intersection with a Y-intercept of the I-V profile.

8. The apparatus of claim 5, wherein the discharge boundary condition comprises a discharge current upper limit and a discharge voltage lower limit.

9. The apparatus of claim 5, further comprising the storage unit connected to the control unit, wherein the control unit stores the estimated discharge power into the storage unit.

10. The apparatus of claim 5, further comprising a display unit connected to the control unit, wherein the control unit displays the estimated discharge power through the display unit.

11. The apparatus of claim 5, further comprising a communication interface connected to the control unit, wherein the control unit externally transmits the estimated discharge power through the communication interface.

12. An apparatus for estimating maximum discharge power of a lithium secondary battery, comprising:
a storage unit storing therein a maximum discharge power look-up table that defines the maximum discharge power according to each state of charge among a plurality of states of charge, wherein the maximum discharge power is determined from current and voltage at a point of intersection at which a current-voltage (I-V) profile corresponding to each state of charge meets a discharge boundary condition;
a sensor unit configured to measure a discharge current of the secondary battery during discharging of the secondary battery; and
a control unit configured to determine a state of charge of the secondary battery, and determine the maximum discharge power corresponding to the determined state of charge using the maximum discharge power look-up table,
wherein I-V profiles corresponding to the plurality of states of charge increase in non-linearity as the corresponding states of charge decrease, such that a maximum discharge current of the secondary battery determined by Hybrid Pulse Power Characterization (HPPC) is greater than an operating current upper limit of the secondary battery.

13. The apparatus of claim 12, wherein the maximum discharge power look-up table is separately defined according to a temperature of the secondary battery,
the sensor unit further measures the temperature of the secondary battery, and
the control unit identifies the maximum discharge power look-up table corresponding to the measured temperature, and determines the maximum discharge power by using the identified maximum discharge power look-up table.

14. The apparatus of claim 12, wherein the discharge boundary condition comprises a discharge current upper limit and a discharge voltage lower limit.

15. The apparatus of claim 12, further comprising the storage unit connected to the control unit, wherein the control unit stores the estimated maximum discharge power into the storage unit.

16. The apparatus of claim 12, further comprising a display unit connected to the control unit, wherein the control unit displays the estimated maximum discharge power through the display unit.

17. The apparatus of claim 12, further comprising a communication interface connected to the control unit, wherein the control unit externally transmits the estimated maximum discharge power through the communication interface.

18. A method for estimating discharge power of a lithium secondary battery, comprising:
(a) loading a resistance look-up table that defines a resistance according to each state of charge among a plurality of states of charge, wherein the resistance is determined by using a point of intersection at which a current-voltage (I-V) profile corresponding to each state of charge meets a discharge boundary condition;
(b) measuring a discharge current of the secondary battery during discharging of the secondary battery;
(c) determining a state of charge of the secondary battery;
(d) determining the resistance corresponding to the determined state of charge by using the resistance look-up table; and
(e) estimating the discharge power corresponding to the secondary battery from the determined resistance and the measured discharge current, wherein the I-V profiles corresponding to the plurality of states of charge increase in non-linearity as the corresponding states of charge decrease, such that a maximum discharge current of the secondary battery determined by Hybrid Pulse Power Characterization (HPPC) is greater than an operating current upper limit of the secondary battery.

19. The method of claim 18, wherein the resistance look-up table is separately defined according to a temperature of the secondary battery.

20. The method of claim 19, wherein the operation at (b) further comprises measuring the temperature of the secondary battery, and
prior to the operation at (d), the method further comprises identifying the resistance look-up table that corresponds to the measured temperature from among a plurality of resistance look-up tables.

21. The method of claim 18, further comprising storing, displaying or transmitting the estimated discharge power.

22. A method for estimating maximum discharge power of a lithium secondary battery, comprising:
(a) loading a maximum discharge power look-up table that defines the maximum discharge power determined from current and voltage at a point of intersection at which a current-voltage (I-V) profile corresponding to each state of charge among a plurality of states of charge meets a discharge boundary condition;
(b) determining a state of charge of the secondary battery; and
(c) determining the maximum discharge power corresponding to the determined state of charge using the maximum discharge power look-up table,
wherein I-V profiles corresponding to the plurality of states of charge increase in non-linearity as the corresponding states of charge decrease, such that a maximum discharge current of the secondary battery determined by Hybrid Pulse Power Characterization (HPPC) is greater than an operating current upper limit of the secondary battery.

23. The method of claim 22, wherein the maximum discharge power look-up table is separately defined according to a temperature of the secondary battery.

24. The method of claim 22, wherein prior to the operation at (b), further comprising measuring a temperature of the secondary battery, and the operation at (c) further comprises identifying the maximum discharge power look-up table that corresponds to the measured temperature from among a plurality of maximum discharge power look-up tables.

25. The method of claim 22, further comprising storing, displaying or transmitting the estimated maximum discharge power.

* * * * *